(12) United States Patent
Yu

(10) Patent No.: US 7,976,714 B2
(45) Date of Patent: Jul. 12, 2011

(54) SINGLE SOI WAFER ACCELEROMETER FABRICATION PROCESS

(75) Inventor: Lianzhong Yu, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 531 days.

(21) Appl. No.: 11/969,505

(22) Filed: Jan. 4, 2008

(65) Prior Publication Data
US 2009/0176370 A1   Jul. 9, 2009

(51) Int. Cl.
*C23F 1/00* (2006.01)
(52) U.S. Cl. ............... 216/2; 216/99; 438/689
(58) Field of Classification Search ........... 216/2, 99; 438/689
See application file for complete search history.

(56) References Cited

U.S. PATENT DOCUMENTS

| 6,410,361 B2 * | 6/2002 | Dhuler et al. ............ 438/54 |
| 7,138,694 B2 | 11/2006 | Nunan et al. |
| 7,190,007 B2 | 3/2007 | Breitwisch et al. |

* cited by examiner

*Primary Examiner* — Roberts Culbert
(74) *Attorney, Agent, or Firm* — Black Lowe & Graham PLLC

(57) ABSTRACT

Methods for producing a MEMS device from a single silicon-on-insulator (SOI) wafer. An SOI wafer includes a silicon (Si) handle layer, a Si mechanism layer and an insulator layer located between the Si handle and Si mechanism layers. An example method includes etching active components from the Si mechanism layer. Then, the exposed surfaces of the Si mechanism layer is doped with boron. Next, portions of the insulator layer proximate to the etched active components of the Si mechanism layer are removed and the Si handle layer is etched proximate to the etched active components.

3 Claims, 1 Drawing Sheet

SINGLE SOI WAFER ACCELEROMETER FABRICATION PROCESS

BACKGROUND OF THE INVENTION

There exists many types of processes for fabricating microelectro mechanical systems (MEMS) accelerometers or gyros. In order to produce a MEMS device that has low parasitic capacitance, multiple wafers must pass through multiple masking, etching and attachment steps in order to produce an effective MEMS device. The greater the number of processing steps, the greater the fabrication costs.

SUMMARY OF THE INVENTION

The present invention includes methods for producing a MEMS device from a single silicon-on-insulator (SOI) wafer. An SOI wafer includes a silicon (Si) handle layer, a Si mechanism layer and an insulator layer located between the Si handle and Si mechanism layers. An example method includes etching active components from the Si mechanism layer. Then, the exposed surfaces of the Si mechanism layer is doped with boron. Next, portions of the insulator layer proximate to the etched active components of the Si mechanism layer are removed and the Si handle layer is etched proximate to the etched active components.

The etching of the handle layer is an anisotropic etch.

BRIEF DESCRIPTION OF THE DRAWINGS

Preferred and alternative embodiments of the present invention are described in detail below with reference to the following drawings.

DETAILED DESCRIPTION OF THE PREFERRED EMBODIMENT

FIGS. 1-4 illustrate example fabrication process steps performed in accordance with an embodiment of the present invention. The example process described produces a microelectro mechanical systems (MEMS) accelerometer from a single silicon-on-insulator (SOI) wafer 20 with low parasitic capacitance between proof masses or other components that might be sensitive to an undesirable capacitance in a mechanism layer 24 and a silicon (Si) handle layer 28.

Figure 1:
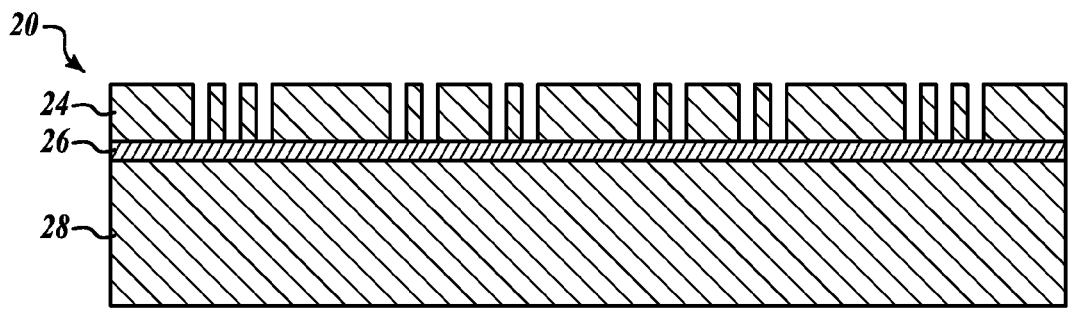
FIGS. 1-4 illustrate an example process for fabricating an accelerometer device.

As shown in FIG. 1, the SOI wafer 20 includes a buried silicon oxide ($SiO_2$) layer 26 that is located between the mechanism layer 24 and the Si handle layer 28. The mechanism layer 24 is etched according to a predefined mask for exposing functional elements (active components) within the mechanism layer 24.

In one embodiment, the SOI wafer 20 is a P-type SOI wafer. The etching performed on the mechanism layer 24 is a silicon deep reactive ion etch (DRIE) that etches through the mechanism layer 24 all the way to the $SiO_2$ layer 26 that acts as an etch stop. Thus, a predefined array/pattern of holes/cavities are formed in the mechanism layer 24

Figure 2:
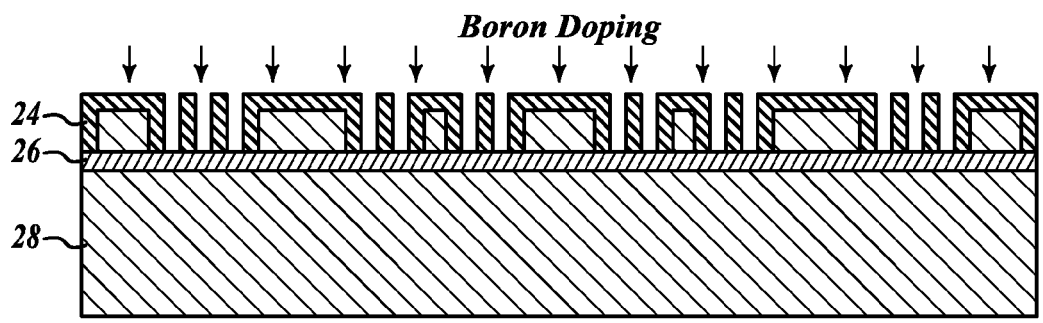

As shown in FIG. 2, the mechanism layer 24 is heavily doped with boron. In one embodiment, the mechanism layer 24 is doped with boron at a concentration level greater than $5 \times 10^{18}/Cm^3$.

The boron doping penetrates both the horizontal and vertical surfaces exposed in the etched mechanism layer 24. The silicon oxide layer 26 is resistant to boron doping thereby preventing doping the handle layer 28.

Figure 3:
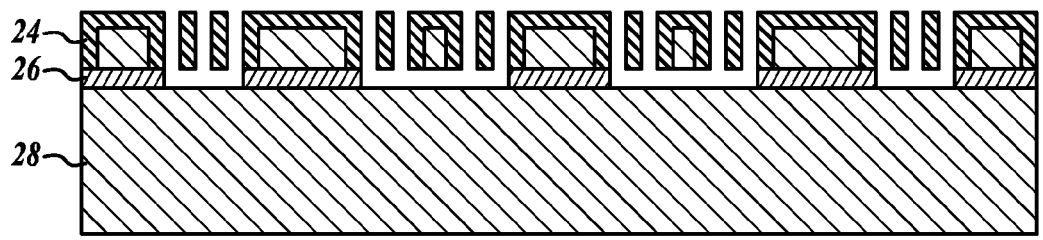

As shown in FIG. 3, portions of the $SiO_2$ layer 26 are removed in and around the active components of the mechanism layer 24. A standard silicon oxide (wet) etch (e.g., HF) is applied to the silicon oxide layer 26 via the cavities and holes that were etched into the mechanism layer 24. Silicon is naturally resistant to HF etch or etches extremely slow (no matter if it is doped or not).

Figure 4:
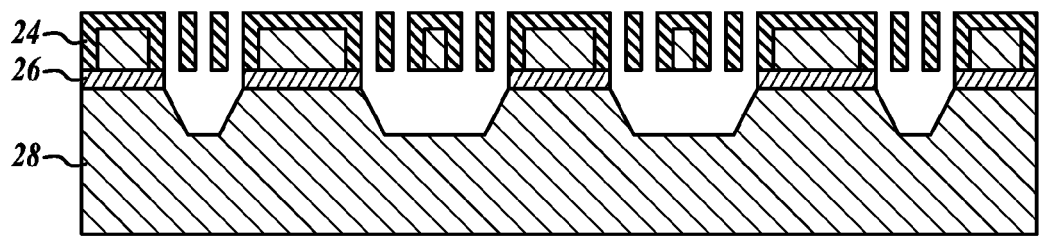

As shown in FIG. 4, in one embodiment an Ethylene-Diamene-Pyrocatechol (EDP) silicon anisotropic etch is applied to the Si handle layer 28 through the cavities formed through the mechanism layer 24 and in the location where the silicon oxide layer 26 has been removed. The boron doped mechanism layer 24 is resistant to this EDP etch. The length of time for the EDP etch depends on depth of Si etch desired. Example etch time can be 1~2 hours for 50~100 μm. The result is a cavity in the Si handle layer 28 that provides separation between the silicon in the Si handle layer 28 and any active components within the mechanism layer 24. The result is a reduction in parasitic capacitance that may occur between the mechanism layer 24 and the Si handle layer 28. Also, potential stiction between layers 24 and 28 of active component is eliminated. Other comparable anisotropic etchants may be used.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for producing a MEMS device from a single silicon-on-insulator (SOI) wafer, the SOI wafer includes a silicon (Si) handle layer, a Si mechanism layer and an insulator layer located between the Si handle and Si mechanism layers, the method comprising:
    etching active components from the Si mechanism layer;
    after etching, doping exposed surfaces of the Si mechanism layer with at least boron;
    after doping, removing portions of the insulator layer proximate to the etched active components of the Si mechanism layer; and
    after removing, etching the Si handle layer proximate to the etched active components.

2. The method of claim 1, wherein etching the handle layer includes anisotropically etching.

3. The method of claim 1, wherein the insulator layer includes $SiO_2$.

* * * * *